(12) United States Patent
Tsuchida et al.

(10) Patent No.: US 10,006,947 B2
(45) Date of Patent: Jun. 26, 2018

(54) CURRENT DETECTION CIRCUIT UNAFFECTED BY NOISE

(71) Applicant: FANUC CORPORATION, Minamitsuru-gun, Yamanashi (JP)

(72) Inventors: Kunio Tsuchida, Yamanashi (JP); Taku Sasaki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days. days.

(21) Appl. No.: 15/213,782

(22) Filed: Jul. 19, 2016

(65) Prior Publication Data

US 2017/0023623 A1    Jan. 26, 2017

(30) Foreign Application Priority Data

Jul. 22, 2015   (JP) ................................. 2015-144983

(51) Int. Cl.
*G01R 19/10*   (2006.01)
*H02P 27/06*   (2006.01)
(Continued)

(52) U.S. Cl.
CPC ......... *G01R 19/10* (2013.01); *G01R 19/0053* (2013.01); *G01R 1/203* (2013.01)

(58) Field of Classification Search
CPC ..... G01R 19/10; G01R 19/0053; G01R 1/203
See application file for complete search history.

(56) References Cited

U.S. PATENT DOCUMENTS

| 4,001,660 A | * | 1/1977 | Lipo ..................... H02P 27/048 318/802 |
| 5,656,897 A | * | 8/1997 | Carobolante .......... H02P 6/085 318/400.09 |

(Continued)

FOREIGN PATENT DOCUMENTS

| JP | S63143263 A | 6/1988 |
| JP | H11316249 A | 11/1999 |

(Continued)

OTHER PUBLICATIONS

Notification of Reasons for Refusal for Japanese Application No. 2015-144983, dated Sep. 14, 2017, including English translation, 5 pages.

*Primary Examiner* — Patrick Assouad
*Assistant Examiner* — Haidong Zhang
(74) *Attorney, Agent, or Firm* — RatnerPrestia

(57) ABSTRACT

A current detection circuit includes a first resistor and a second resistor identical in current path and equal in resistance value, a first and second signal transmission units which transmit respectively a signal representing the potential of the first resistor, a third and fourth signal transmission units which transmit respectively a signal representing the potential of the second resistor, a first difference operation unit which calculates the difference between the respective signals from the first and second signal transmission units, a second difference operation unit which calculates the difference between the respective signals from the third and fourth signal transmission units, and a summing unit which sums the signals output from the first and second difference operation units. The first signal transmission unit and the fourth signal transmission unit, and the second signal transmission unit and the third signal transmission unit are disposed in proximity to each other.

2 Claims, 5 Drawing Sheets

(51) Int. Cl.
G01R 19/00 (2006.01)
*G01R 1/20* (2006.01)

(56) References Cited

U.S. PATENT DOCUMENTS

| | | | | |
|---|---|---|---|---|
| 2009/0121704 A1* | 5/2009 | Shibahara | ............ | G01R 15/202 |
| | | | | 324/117 R |
| 2011/0062934 A1* | 3/2011 | Wolf | ............ | H02M 7/48 |
| | | | | 323/304 |
| 2013/0175956 A1* | 7/2013 | Roh | ............ | H02P 6/15 |
| | | | | 318/400.04 |
| 2016/0341772 A1* | 11/2016 | Roberts | ............ | G01R 19/32 |

FOREIGN PATENT DOCUMENTS

| | | | |
|---|---|---|---|
| JP | 2002191179 A | 7/2002 | |
| JP | 2009139223 A | 6/2009 | |
| JP | 2014-014252 A | 1/2014 | |

\* cited by examiner

CURRENT DETECTION CIRCUIT UNAFFECTED BY NOISE

BACKGROUND OF THE INVENTION

1. Field of the Invention

The present invention relates to a current detection circuit which detects a current flowing through the current path in a motor driving device.

2. Description of the Related Art

In a motor driving device which drives motors within a machine tool, an industrial machine, a forging machine, an injection molding machine, or various robots, AC power input from an AC power supply side is temporarily converted by a converter into DC power, which is further converted into AC power by an inverter. The AC power is used as driving power for the motors.

FIG. 4 is a circuit diagram illustrating a general motor driving device. In, e.g., a motor driving device 100 which drives a three-phase AC motor 200, the DC input side of an inverter 51 is applied with a DC voltage from a DC power supply and outputs a three-phase AC current for driving the motor 200. A smoothing capacitor 53 is located on the DC input side of the inverter 51. Although not particularly illustrated herein, a converter (rectifier) which converts an AC current input from a commercial AC power supply into a DC current and outputs the DC current is generally located on the DC input side of the inverter 51.

The inverter 51 is implemented in a full-bridge inverter including upper and lower arms, each of which is provided with switching elements $S_{u1}$, $S_{v1}$, $S_{w1}$, $S_{u2}$, $S_{v2}$, and $S_{w2}$ including an inverse parallel circuit consisting of reflux diodes. More specifically, a series circuit is formed by the switching elements $S_{u1}$ and $S_{u2}$ for phase u, another series circuit is formed by the switching elements $S_{v1}$ and $S_{v2}$ for phase v, and still another series circuit is formed by the switching elements $S_{w1}$ and $S_{w2}$ for phase w. Gate driving commands $G_{u1}$, $G_{v1}$, $G_{w1}$, $G_{u2}$, $G_{v2}$, and $G_{w2}$ are supplied from a current control unit 52 to the gates of the switching elements $S_{u1}$, $S_{v1}$, $S_{w1}$, $S_{u2}$, $S_{v2}$, and $S_{w2}$, respectively, and used for ON/OFF control of the switching elements $S_{u1}$, $S_{v1}$, $S_{w1}$, $S_{u2}$, $S_{v2}$ and $S_{w2}$, respectively. With this operation, the inverter 51 converts DC power input from the DC input side into an AC current having desired frequencies and voltages for driving a three-phase AC motor.

The current control unit 52 generates gate driving commands $G_{u1}$, $G_{v1}$, $G_{w1}$, $G_{u2}$, $G_{v2}$, and $G_{w2}$, based on an input current command and a feedback value for an AC current flowing from the inverter 51 into the motor 200. The AC current flowing from the inverter 51 into the motor 200 is detected by a current detection circuit 1001. To generate appropriate gate driving commands $G_{u1}$, $G_{v1}$, $G_{w1}$, $G_{u2}$, $G_{v2}$, and $G_{w2}$ to accurately control the motor 200, it is important to perform the above-mentioned current feedback control using a detected current value detected by the current detection circuit 1001 with high accuracy.

One current detection method for the current detection circuit uses a shunt resistance scheme in which a resistor (shunt resistor) is inserted into a current path for current detection, and a voltage generated across the two ends of the resistor when a current flows through the resistor is detected to obtain a current value based on this voltage, as disclosed in, e.g., Japanese Unexamined Patent Publication No. 2014-14252. A shunt resistor is used to convert a current value in the shunt resistor into a voltage across the two ends of the shunt resistor, and the voltage across these two ends is transmitted to an arithmetic circuit in the form of an analog differential signal. However, due to the adverse effect of external noise in the transmission line, the analog differential signal varies, thus lowering the current detection accuracy. Examples of the external noise may include electromagnetic induction. In electromagnetic induction, a magnetic flux generated upon fluctuations in current within a given current path causes differences in potential around the current path. The larger the amount of variation in current flowing through a current path acting as a source of noise or the smaller the distance from a current path acting as a source of noise, the higher the level of noise generated in the current path due to electromagnetic induction. Since, especially, a motor driving device includes current paths suffering considerable variations in current which lead to noise due to electromagnetic induction, a current detection circuit which detects a current flowing through a motor is often disposed in proximity to each such current path. It is, therefore, important to design a current detection circuit which detects a current flowing through a motor, free of the influence of noise due to electromagnetic induction generated in such current paths.

In a current detection circuit of the shunt resistance scheme, one method for reducing the adverse effect of external noise is used to dispose differential signal lines in proximity to each other. FIG. 5 is a circuit diagram for explaining a general method for reducing the adverse effect of external noise in a current detection circuit of the conventional shunt resistance scheme. A current detection circuit 1001 of the general shunt resistance scheme includes a shunt resistor 61, a difference operation unit 63, and transmission lines 62-1 and 62-2. The shunt resistor 61 is placed in a current path for current detection. The difference operation unit 63 includes differential input and output terminals on the current input and output sides, respectively, of the shunt resistor 61. The transmission lines 62-1 and 62-2 connect the current input and output terminals of the shunt resistor 61 to the positive and negative input terminals, respectively, of the difference operation unit 63. When the transmission lines 62-1 and 62-2 are disposed in proximity to each other, external noise generated from an external noise source 300 similarly adversely affects the transmission lines 62-1 and 62-2 (referring to FIG. 5, reference numeral 301 denotes the waveform of noise components). However, signals respectively transmitted via the transmission lines 62-1 and 62-2 are input to the positive input terminal (+) and the negative input terminal (−), respectively, of the difference operation unit 63, and noise components of each signal are canceled by difference operation by the difference operation unit 63 so that the adverse effect of common-mode noise disappears. Referring to FIG. 5, reference numeral 401 denotes the waveform of a signal output from the difference operation unit 63.

FIG. 6 is a circuit diagram for explaining the adverse effect of external noise when transmission lines which connect the current input and output terminals of a shunt resistor to the positive and negative input terminals, respectively, of a difference operation unit are disposed without proximity to each other in a current detection circuit of the conventional shunt resistance scheme. When a transmission line 62-1 which connects the current input terminal of a shunt resistor 61 to the positive input terminal (+) of the difference operation unit 63 and a transmission line 62-2 which connects the current output terminal of the shunt resistor 61 to the negative input terminal (+) of the difference operation unit 63 are disposed without proximity to each other, a difference occurs in adverse effect of external noise between the transmission lines 62-1 and 62-2 (referring to FIG. 6, reference numeral 302 denotes the waveform of noise components). Noise components of signals respectively transmitted via the transmission lines 62-1 and 62-2 may not be canceled, depending on how difference operation is performed by the difference operation unit 63, and the adverse effect of external noise may therefore remain in a signal output from the difference operation unit 63. Referring to FIG. 6, reference numeral 402 denotes the waveform of a signal output from the difference operation unit 63.

As described above, in a current detection circuit of the shunt resistance scheme, to reduce the adverse effect of external noise, transmission lines which connect the current input and output terminals of a shunt resistor to the positive and negative input terminals, respectively, of a difference operation unit are desirably disposed in proximity to each other.

Unfortunately, since it is difficult in practice to dispose these transmission lines in proximity to each other. Especially transmission lines in the vicinity of the shunt resistor and transmission lines in the vicinity of the difference operation unit may not be disposed in proximity to each other due to factors associated with the physical structures of the shunt resistor and the difference operation unit. Therefore, noise components of signals respectively transmitted via the transmission lines may not be canceled, depending on how difference operation is performed by the difference operation unit, and the adverse effect of external noise may therefore remain in a signal output from the difference operation unit. Especially a motor driving device includes a large number of current paths which pass high currents so noise due to electromagnetic induction has a remarkable adverse effect. When a detected current value detected by a current detection circuit includes the adverse effect of external noise, a motor driving device which uses the detected current value for feedback control may not generate appropriate gate driving commands and, in turn, may not achieve precise motor control.

SUMMARY OF INVENTION

In view of the above problems, an object of the present invention is to provide a current detection circuit of the shunt resistance scheme which can accurately detect a current flowing through the current path in a motor driving device, free of the influence of external noise.

In order to achieve the above object, a current detection circuit which detects a current flowing through the current path in a motor driving device includes, a first resistor and a second resistor which are located in an identical current path and have equal resistance values, a first signal transmission unit which transmits a signal representing the potential on the first terminal side of the first resistor, a second signal transmission unit which transmits a signal representing the potential on the second terminal side of the first resistor, a third signal transmission unit which transmits a signal representing the potential on the first terminal side of the second resistor, a fourth signal transmission unit which transmits a signal representing the potential on the second terminal side of the second resistor, a first difference operation unit which calculates a difference between the signal transmitted by the first signal transmission unit and the signal transmitted by the second signal transmission unit to obtain a first differential signal, a second difference operation unit which calculates a difference between the signal transmitted by the third signal transmission unit and the signal transmitted by the fourth signal transmission unit to obtain a second differential signal, and a summing unit which sums the first differential signal and the second differential signal to obtain a summation signal, wherein the first signal transmission unit and the fourth signal transmission unit are disposed in proximity to each other, and the second signal transmission unit and the third signal transmission unit are disposed in proximity to each other.

The first resistor and the second resistor, the first signal transmission unit and the fourth signal transmission unit, the second signal transmission unit and the third signal transmission unit, and the first difference operation unit and the second difference operation unit may be disposed on respective surfaces of a printed circuit board in plane symmetry with respect to the printed circuit board.

BRIEF DESCRIPTION OF THE DRAWINGS

The present invention will be more clearly understood by reference to the accompanying drawings, in which.

DETAILED DESCRIPTION

A current detection circuit unaffected by noise will be described below with reference to the drawings. However, it should be understood that the present invention is not to be limited to the drawings or the embodiments described below.

Figure 1:
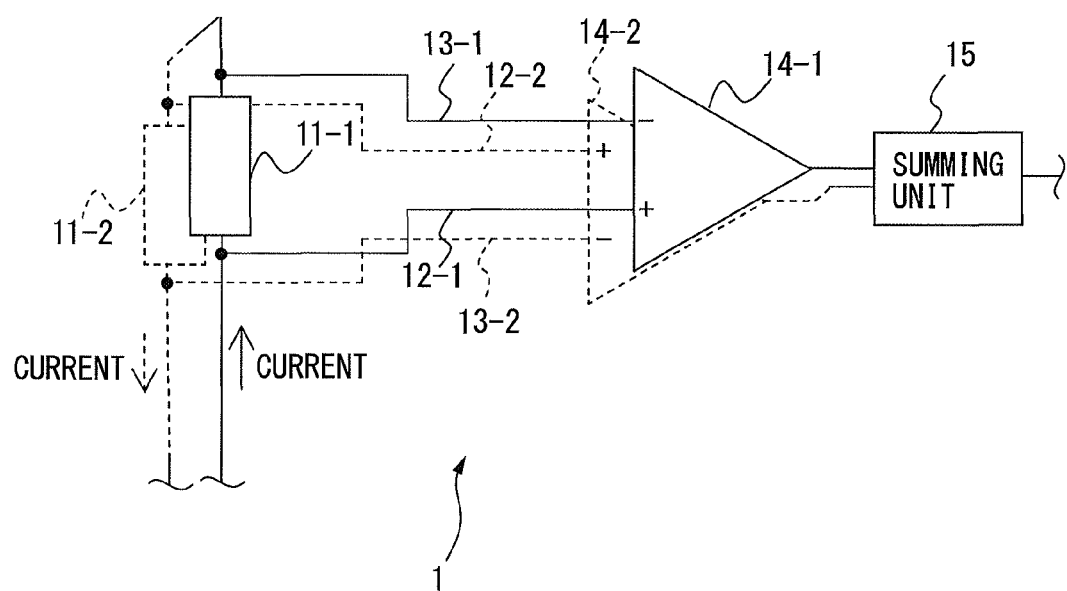
FIG. 1 is a schematic diagram schematically illustrating a current detection circuit according to an embodiment.
Figure 2:
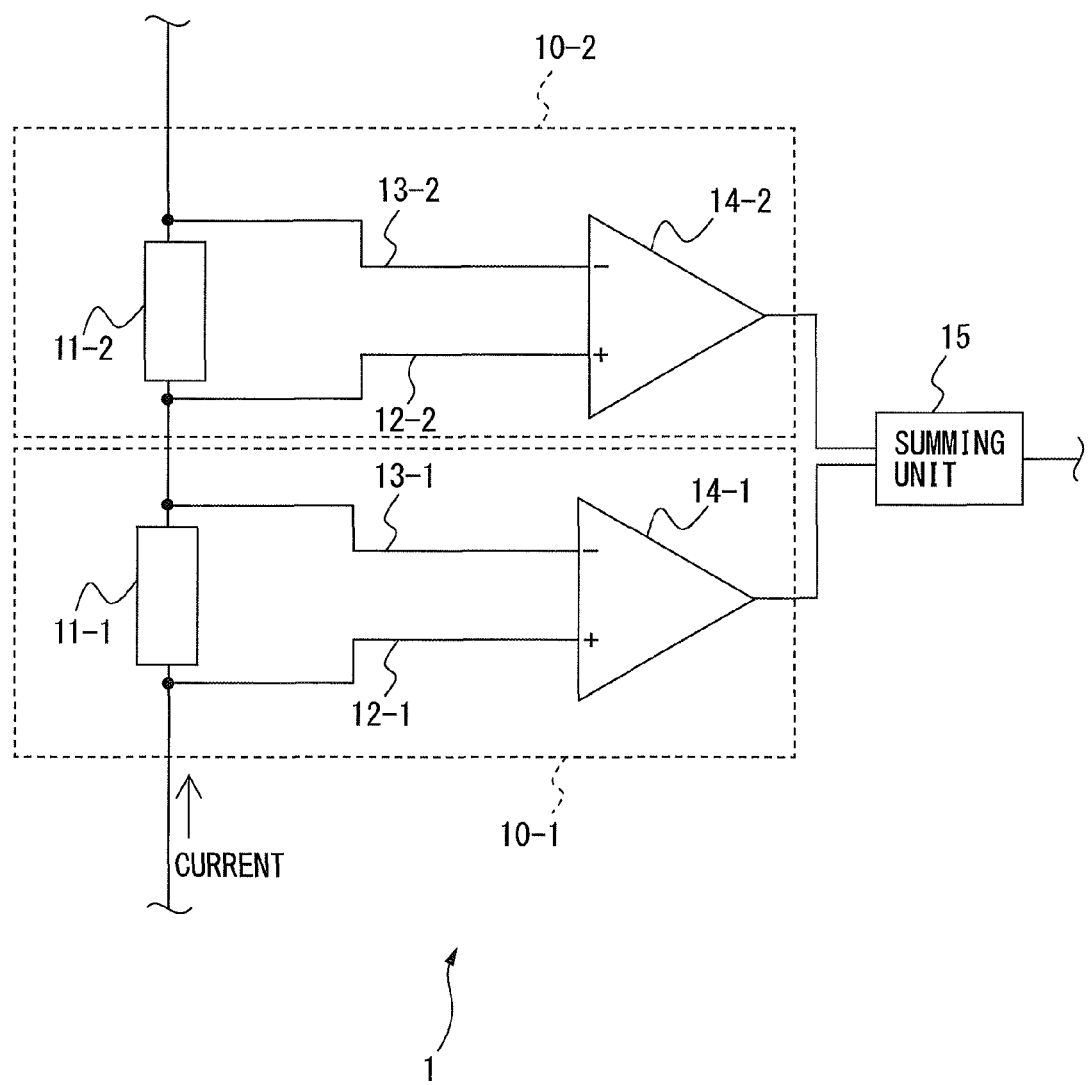
FIG. 2 is a circuit diagram illustrating the current detection circuit depicted as FIG. 1.

FIG. 1 is a schematic diagram schematically illustrating a current detection circuit according to an embodiment, and FIG. 2 is a circuit diagram illustrating the current detection circuit depicted as FIG. 1. The same reference numerals in different drawings denote components having the same functions hereinafter.

In a current detection circuit 1 according to the embodiment, corresponding components are disposed on respective surfaces of a printed circuit board in plane symmetry with respect to the printed circuit board, although details will be described later. FIG. 1 uses solid lines to indicate components arranged on the upper surface of a printed circuit board, and broken lines to indicate components arranged on the lower surface of the printed circuit board. For the sake of simplicity, FIG. 1 does not illustrate the printed circuit board. Since the terms "upper surface" and "lower surface" with regard to the printed circuit board are merely used for the sake of convenience, a surface provided with components indicated by solid lines may be referred to as the "lower surface" and a surface provided with components indicated by broken lines may be referred to as the "upper surface," in FIG. 1. FIG. 2 provides a simpler representation of the current detection circuit 1 depicted as FIG. 1, on a planar circuit diagram. In an example illustrated as FIGS. 1 and 2, a current flows from a first resistor 11-1 to a second resistor 11-2. However, even when a current flows from the second resistor 11-2 to the first resistor 11-1, the current detection circuit 1 can detect the current in accordance with the same principle.

The current detection circuit 1 according to the embodiment includes the first resistor 11-1, the second resistor 11-2, a first signal transmission unit 12-1, a second signal transmission unit 13-1, a third signal transmission unit 12-2, a fourth signal transmission unit 13-2, a first difference operation unit 14-1, a second difference operation unit 14-2, and a summing unit 15. The first resistor 11-1 and the second resistor 11-2 are located in an identical current path for current detection and have equal resistance values.

The first signal transmission unit 12-1 serves as a signal line which transmits a signal representing the potential on the first terminal side of the first resistor 11-1.

The second signal transmission unit 13-1 serves as a signal line which transmits a signal representing the potential on the second terminal side of the first resistor 11-1.

The third signal transmission unit 12-2 serves as a signal line which transmits a signal representing the potential on the first terminal side of the second resistor 11-2.

The fourth signal transmission unit 13-2 serves as a signal line which transmits a signal representing the potential on the second terminal side of the second resistor 11-2.

The first difference operation unit 14-1 calculates the difference between the signal transmitted by the first signal transmission unit 12-1 and the signal transmitted by the second signal transmission unit 13-1 to obtain a first differential signal.

The second difference operation unit 14-2 calculates the difference between the signal transmitted by the third signal transmission unit 12-2 and the signal transmitted by the fourth signal transmission unit 13-2 to obtain a second differential signal.

The summing unit 15 sums the first differential signal output from the first difference operation unit 14-1 and the second differential signal output from the second difference operation unit 14-2 to obtain a summation signal. The current detection circuit 1 sends the summation signal to a subsequent circuit (not illustrated; e.g., a current control unit in the motor driving device) as a signal representing a current flowing through the current path.

In the embodiment, the first signal transmission unit 12-1 and the fourth signal transmission unit 13-2 are disposed in proximity to each other, and the second signal transmission unit 13-1 and the third signal transmission unit 12-2 are disposed in proximity to each other. More specifically, the first signal transmission unit 12-1 and the fourth signal transmission unit 13-2 are disposed on respective surfaces of a printed circuit board in plane symmetry with respect to the printed circuit board. Similarly, the second signal transmission unit 13-1 and the third signal transmission unit 12-2 are disposed on respective surfaces of the printed circuit board in plane symmetry with respect to the printed circuit board.

Further, in the embodiment, the first resistor 11-1 and the second resistor 11-2 are disposed on respective surfaces of the printed circuit board in plane symmetry with respect to the printed circuit board. With this arrangement, the first resistor 11-1 and the second resistor 11-2 are also disposed in proximity to each other. Similarly, the first difference operation unit 14-1 and the second difference operation unit 14-2 are disposed on respective surfaces of the printed circuit board in plane symmetry with respect to the printed circuit board. With this arrangement, the first difference operation unit 14-1 and the second difference operation unit 14-2 are also disposed in proximity to each other.

As described above, in the embodiment, the first resistor 11-1 and the second resistor 11-2, the first signal transmission unit 12-1 and the fourth signal transmission unit 13-2, the second signal transmission unit 13-1 and the third signal transmission unit 12-2, and the first difference operation unit 14-1 and the second difference operation unit 14-2 are disposed on respective surfaces of the printed circuit board in plane symmetry with respect to the printed circuit board. In other words, a first differential signal transmission circuit 10-1 (see FIG. 1 and solid lines in FIG. 3 (to be described later)) including the first resistor 11-1, the first signal transmission unit 12-1, the second signal transmission unit 13-1, and the first difference operation unit 14-1 is formed on the upper surface of the printed circuit board, and a second differential signal transmission circuit 10-2 (see FIG. 1 and broken lines in FIG. 3 (to be described later)) including the second resistor 11-2, the third signal transmission unit 12-2, the fourth signal transmission unit 13-2, and the second difference operation unit 14-2 is formed on the lower surface of the printed circuit board. With such an arrangement, the first differential signal transmission circuit 10-1 and the second differential signal transmission circuit 10-2 are disposed on respective surfaces of the printed circuit board in plane symmetry with respect to the printed circuit board and are reverse in signal polarity from each other. Since a printed circuit board generally has a thickness of about several millimeters, the first differential signal transmission circuit 10-1 and the second differential signal transmission circuit 10-2 disposed on the two surfaces of the printed circuit board can be said to be sufficiently in proximity to each other. In particular, the conventional technique does not allow transmission lines in the vicinity of the shunt resistor and transmission lines in the vicinity of the difference operation unit to be disposed in proximity to each other due to factors associated with the physical structures of the shunt resistor and the difference operation unit, but the present invention achieves such a proximity configuration by additionally disposing the first resistor 11-1 and the second resistor 11-2, and the first difference operation unit 14-1 and the second difference operation unit 14-2 on respective surfaces of the printed circuit board in plane symmetry with respect to the printed circuit board. This, in turn, achieves more accurate current detection.

Figure 3:
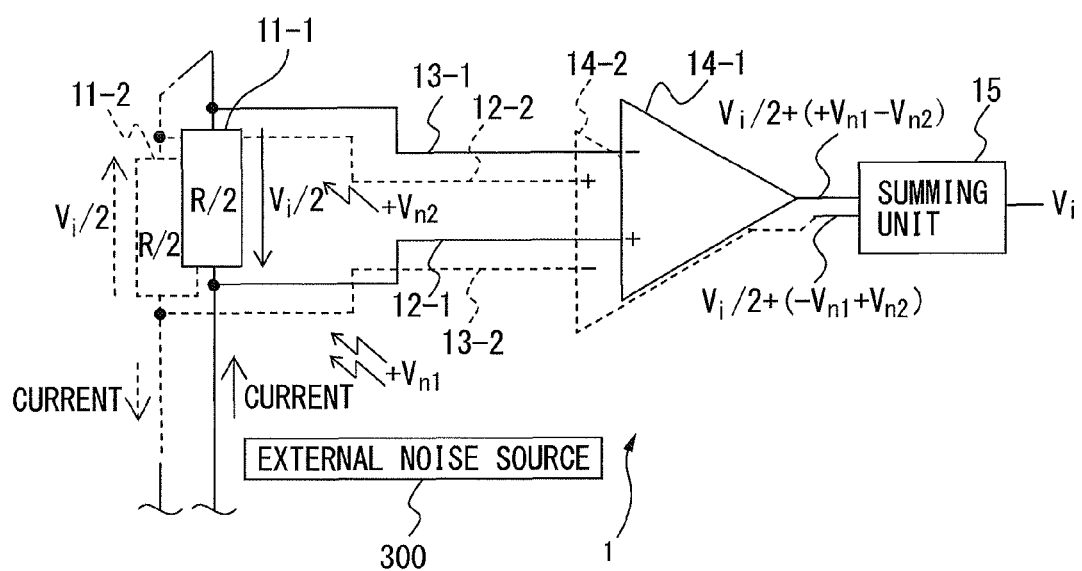
FIG. 3 is a diagram for explaining the operation principle of the current detection circuit according to the embodiment.
Figure 4:
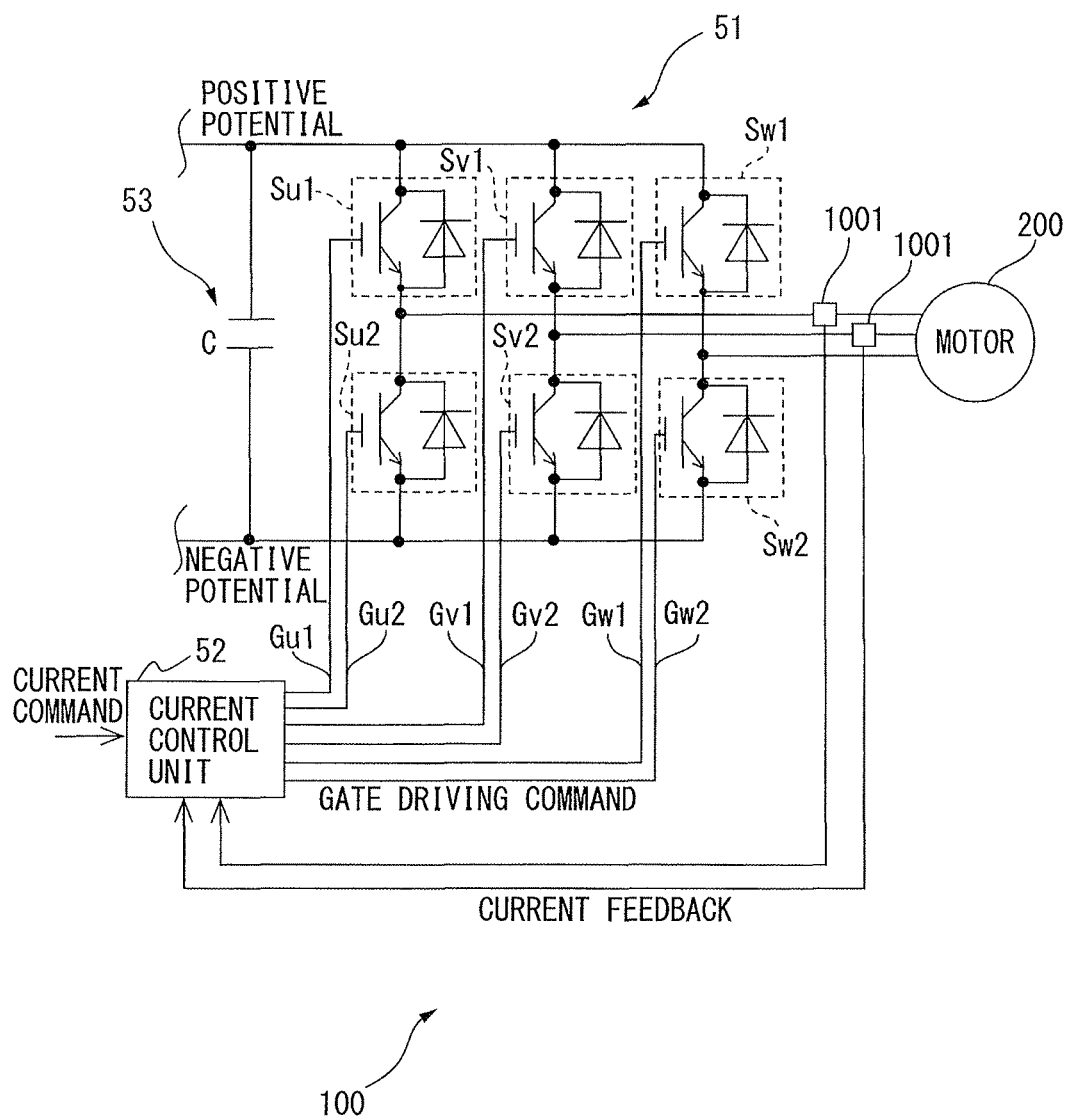
FIG. 4 is a circuit diagram illustrating a general motor driving device.
Figure 5:
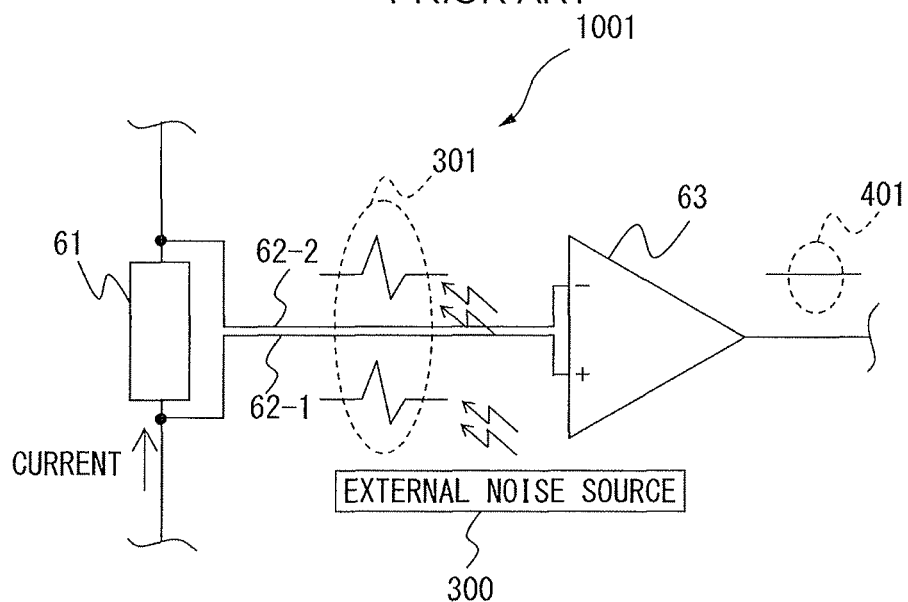
FIG. 5 is a circuit diagram for explaining a general method for reducing the adverse effect of external noise in a current detection circuit of the conventional shunt resistance scheme.
Figure 6:
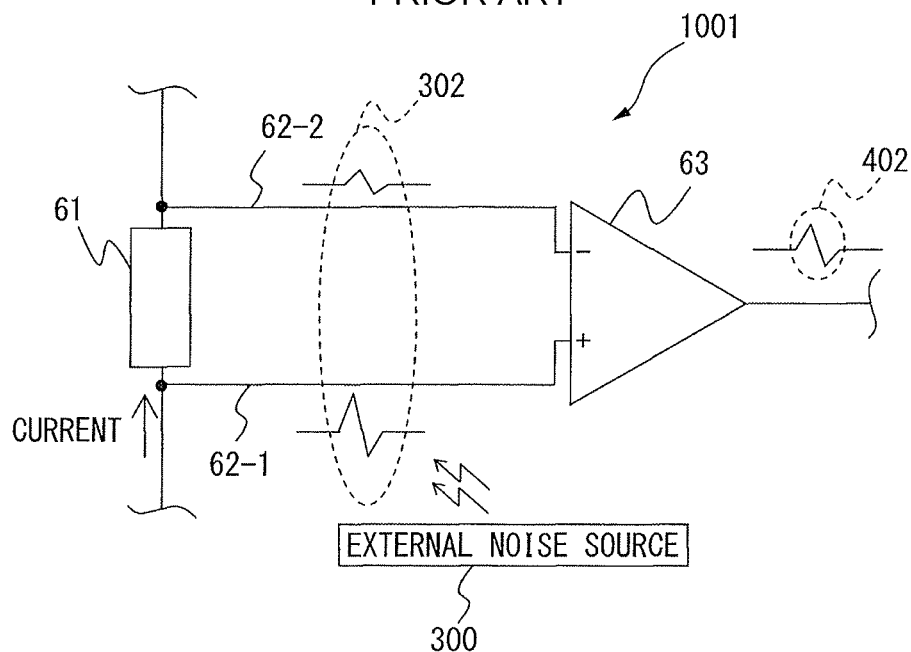
FIG. 6 is a circuit diagram for explaining the adverse effect of external noise when transmission lines which connect the current input and output terminals of a shunt resistor to the positive and negative input terminals, respectively, of a difference operation unit are disposed without proximity to each other in a current detection circuit of the conventional shunt resistance scheme.

FIG. 3 is a diagram for explaining the operation principle of the current detection circuit according to the embodiment. Referring to FIG. 3, a representation of the voltage and resistance values of each unit is added to FIG. 1. Like FIG. 1, FIG. 3 uses solid lines to indicate components arranged on the upper surface of a printed circuit board, and broken lines to indicate components arranged on the lower surface of the printed circuit board. For the sake of simplicity, FIG. 3 does not illustrate the printed circuit board.

The first resistor 11-1 and the second resistor 11-2 have equal resistance values, which are both defined as "R/2." Since the first resistor 11-1 and the second resistor 11-2 are located in the identical current path, a current flowing through the first resistor 11-1 also flows through the second resistor 11-2. Equal currents flow through the first resistor 11-1 and the second resistor 11-2, each of which is assumed to generate a voltage value "$V_i/2$." In other words, equal currents flow through the first resistor 11-1 and the second resistor 11-2, which generate a total voltage "$V_i$." At this point in time, the voltage contains no noise components derived from the external noise source 300.

In an example illustrated as FIG. 3, the external noise source 300 is assumed to be located more to a pair of the first signal transmission unit 12-1 and the fourth signal transmission unit 13-2 than to a pair of the second signal transmission unit 13-1 and the third signal transmission unit 12-2. External noise is assumed to be imposed by the external noise source 300 on the first signal transmission unit 12-1 and the fourth signal transmission unit 13-2 by "+$V_{n1}$" and on the second signal transmission unit 13-1 and the third signal transmission unit 12-2 by "+$V_{n2}$."

On the above-mentioned assumptions, the first difference operation unit 14-1 calculates the difference between the signal transmitted by the first signal transmission unit 12-1 and the signal transmitted by the second signal transmission unit 13-1 to output a first differential signal representing the voltage "$V_i/2+V_{n1}-V_{n2}$." The second difference operation unit 14-2 calculates the difference between the signal transmitted by the third signal transmission unit 12-2 and the signal transmitted by the fourth signal transmission unit 13-2 to output a second differential signal representing the voltage "$V_i/2-V_{n1}+V_{n2}$." The summing unit 15 sums the first differential signal representing the voltage "$V_i/2+V_{n1}-V_{n2}$" output from the first difference operation unit 14-1 and the second differential signal representing the voltage "$V_i/2-V_{n1}+V_{n2}$" output from the second difference operation unit 14-2 to obtain a summation signal representing the voltage "$V_i$." In other words, according to the embodiment, a total voltage "$V_i$" generated by the first resistor 11-1 and the second resistor 11-2 can be obtained for even signals having passed through the first differential signal transmission circuit 10-1 and the second differential signal transmission circuit 10-2. As can be seen from the foregoing description, according to the embodiment, a current can be accurately detected free of the influence of external noise derived from the external noise source 300.

The use of the above-mentioned current detection circuit 1 for motor current detection in a motor driving device allows feedback control using a current accurately detected free of the influence of external noise, thus achieving precise motor control. The current detection circuit 1 may be used not only for motor current detection but also for current detection in a converter (rectifier) which rectifies an AC power supply into a DC power supply. The current detection circuit 1 may further be used for current detection in a motor driving device which drives a DC motor.

The present invention achieves a current detection circuit of the shunt resistance scheme which can accurately detect a current flowing through the current path in a motor driving device, free of the influence of external noise.

The use of the current detection circuit according to the present invention for motor current detection in a motor driving device allows feedback control using a current accurately detected free of the influence of external noise, thus achieving precise motor control. The current detection circuit according to the present invention may be used in a motor driving device not only for motor current detection but also for current detection in a converter (rectifier) which rectifies an AC power supply into a DC power supply. The current detection circuit according to the present invention may further be used for current detection in a motor driving device which drives a DC motor or current detection in electrical devices other than a motor driving device. In both cases, the current detection circuit according to the present invention can accurately detect a current, free of the influence of external noise, thus improving the control and detection accuracies of each device.

What is claimed is:

1. A current detection circuit which detects a current flowing through a current path in a motor driving device that drives a motor having a plurality of phases, the circuit comprising:
   a first resistor and a second resistor wired in series with each other in an identical current path feeding electrical current to one of the plurality of phases of the motor and having equal resistance values;
   a first signal transmission unit which transmits a signal representing a potential on a first terminal side of the first resistor;
   a second signal transmission unit which transmits a signal representing a potential on a second terminal side of the first resistor;
   a third signal transmission unit which transmits a signal representing a potential on a first terminal side of the second resistor;
   a fourth signal transmission unit which transmits a signal representing a potential on a second terminal side of the second resistor;
   a first difference operation unit which calculates a difference between the signal transmitted by the first signal transmission unit and the signal transmitted by the second signal transmission unit to obtain a first differential signal;
   a second difference operation unit which calculates a difference between the signal transmitted by the third signal transmission unit and the signal transmitted by the fourth signal transmission unit to obtain a second differential signal; and
   a summing unit which sums the first differential signal and the second differential signal to obtain a summation signal,
   wherein the first signal transmission unit and the fourth signal transmission unit are disposed in proximity to each other, and the second signal transmission unit and the third signal transmission unit are disposed in proximity to each other.

2. The current detection circuit according to claim 1, wherein the first resistor and the second resistor, the first signal transmission unit and the fourth signal transmission unit, the second signal transmission unit and the third signal transmission unit, and the first difference operation unit and the second difference operation unit are disposed on respective surfaces of a printed circuit board in plane symmetry with respect to the printed circuit board.

* * * * *